United States Patent
Kang et al.

(10) Patent No.: US 7,982,298 B1
(45) Date of Patent: Jul. 19, 2011

(54) PACKAGE IN PACKAGE SEMICONDUCTOR DEVICE

(75) Inventors: Dae Byoung Kang, Hwaseong-si (KR);
Sung Jin Yang, Gangnam-gu (KR);
Jung Tae Ok, Gwangjin-gu (KR); Jae Dong Kim, Gwangjin-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 328 days.

(21) Appl. No.: 12/327,763

(22) Filed: Dec. 3, 2008

(51) Int. Cl.
*H01L 23/48* (2006.01)
(52) U.S. Cl. . 257/686; 257/621; 257/777; 257/E23.116; 257/E23.123; 257/E23.124; 257/E23.126; 257/E23.194; 257/E25.006; 257/E25.013; 257/E25.018; 257/E25.021; 257/E25.027
(58) Field of Classification Search ........... 257/621, 257/686, 777, E23.116, E23.123, E23.124, 257/E23.126, E23.194, E25.006, E25.013, 257/E25.018, E25.021, E25.027
See application file for complete search history.

(56) References Cited

U.S. PATENT DOCUMENTS

| | | | |
|---|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,221,925 A | 9/1980 | Finley et al. |
| 4,258,381 A | 3/1981 | Inaba |
| 4,289,922 A | 9/1981 | Devlin |

(Continued)

FOREIGN PATENT DOCUMENTS

DE 19734794 A1 8/1997
(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Eugene Lee
*Assistant Examiner* — Peniel M Gumedzoe
(74) *Attorney, Agent, or Firm* — Stetina Brunda Garred & Brucker

(57) ABSTRACT

In accordance with the present invention, there is provided multiple embodiments of a package-in-package semiconductor device including shortened electrical signal paths to optimize electrical performance. In each embodiment, the semiconductor device comprises a substrate having a conductive pattern formed thereon. In certain embodiments, a semiconductor package and one or more semiconductor dies are vertically stacked upon the substrate, and placed into electrical communication with the conductive pattern thereof. One or more of the semiconductor dies may include through-silicon vias formed therein for facilitating the electrical connection thereof to the conductive pattern of the substrate or to other electronic components within the vertical stack. Similarly, the semiconductor package may be provided with through-mold vias to facilitate the electrical connection thereof to other electronic components within the vertical stack. In other embodiments of the present invention, a semiconductor die which is electrically connected to the conductive pattern of the substrate is encapsulated with an inner package body which itself is formed to include through-mold vias used to facilitate the electrical connection thereof to another semiconductor die stacked thereon. In each embodiment of the semiconductor device, the vertically stacked electronic components thereof may be covered with a package body which also partially covers the substrate.

18 Claims, 9 Drawing Sheets

U.S. PATENT DOCUMENTS

| | | |
|---|---|---|
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi |
| 6,143,981 A | 11/2000 | Glenn |
| 6,150,709 A | 11/2000 | Shin et al. |
| 6,166,430 A | 12/2000 | Yamaguchi |

| Patent | Kind | Date | Inventor |
|---|---|---|---|
| 6,169,329 | B1 | 1/2001 | Farnworth et al. |
| 6,177,718 | B1 | 1/2001 | Kozono |
| 6,181,002 | B1 | 1/2001 | Juso et al. |
| 6,184,465 | B1 | 2/2001 | Corisis |
| 6,184,573 | B1 | 2/2001 | Pu |
| 6,194,777 | B1 | 2/2001 | Abbott et al. |
| 6,197,615 | B1 | 3/2001 | Song et al. |
| 6,198,171 | B1 | 3/2001 | Huang et al. |
| 6,201,186 | B1 | 3/2001 | Daniels et al. |
| 6,201,292 | B1 | 3/2001 | Yagi et al. |
| 6,204,554 | B1 | 3/2001 | Ewer et al. |
| 6,208,020 | B1 | 3/2001 | Minamio et al. |
| 6,208,021 | B1 | 3/2001 | Ohuchi et al. |
| 6,208,023 | B1 | 3/2001 | Nakayama et al. |
| 6,211,462 | B1 | 4/2001 | Carter, Jr. et al. |
| 6,218,731 | B1 | 4/2001 | Huang et al. |
| 6,222,258 | B1 | 4/2001 | Asano et al. |
| 6,222,259 | B1 | 4/2001 | Park et al. |
| 6,225,146 | B1 | 5/2001 | Yamaguchi et al. |
| 6,229,200 | B1 | 5/2001 | Mclellan et al. |
| 6,229,205 | B1 | 5/2001 | Jeong et al. |
| 6,238,952 | B1 | 5/2001 | Lin et al. |
| 6,239,367 | B1 | 5/2001 | Hsuan et al. |
| 6,239,384 | B1 | 5/2001 | Smith et al. |
| 6,242,281 | B1 | 6/2001 | McClellan et al. |
| 6,256,200 | B1 | 7/2001 | Lam et al. |
| 6,258,629 | B1 | 7/2001 | Niones et al. |
| 6,261,864 | B1 | 7/2001 | Jung et al. |
| 6,281,566 | B1 | 8/2001 | Magni |
| 6,281,568 | B1 | 8/2001 | Glenn et al. |
| 6,282,094 | B1 | 8/2001 | Lo et al. |
| 6,282,095 | B1 | 8/2001 | Houghton et al. |
| 6,285,075 | B1 | 9/2001 | Combs et al. |
| 6,291,271 | B1 | 9/2001 | Lee et al. |
| 6,291,273 | B1 | 9/2001 | Miyaki et al. |
| 6,294,100 | B1 | 9/2001 | Fan et al. |
| 6,294,830 | B1 | 9/2001 | Fjelstad |
| 6,295,977 | B1 | 10/2001 | Ripper et al. |
| 6,297,548 | B1 | 10/2001 | Moden et al. |
| 6,303,984 | B1 | 10/2001 | Corisis |
| 6,303,997 | B1 | 10/2001 | Lee |
| 6,306,685 | B1 | 10/2001 | Liu et al. |
| 6,307,272 | B1 | 10/2001 | Takahashi et al. |
| 6,309,909 | B1 | 10/2001 | Ohgiyama |
| 6,316,822 | B1 | 11/2001 | Venkateshwaran et al. |
| 6,316,838 | B1 | 11/2001 | Ozawa et al. |
| 6,323,550 | B1 | 11/2001 | Martin et al. |
| 6,326,243 | B1 | 12/2001 | Suzuya et al. |
| 6,326,244 | B1 | 12/2001 | Brooks et al. |
| 6,326,678 | B1 | 12/2001 | Karmezos et al. |
| 6,335,564 | B1 | 1/2002 | Pour |
| 6,337,510 | B1 | 1/2002 | Chun-Jen et al. |
| 6,339,252 | B1 | 1/2002 | Niones et al. |
| 6,339,255 | B1 | 1/2002 | Shin |
| 6,342,730 | B1 | 1/2002 | Jung et al. |
| 6,348,726 | B1 | 2/2002 | Bayan et al. |
| 6,355,502 | B1 | 3/2002 | Kang et al. |
| 6,359,221 | B1 | 3/2002 | Yamada et al. |
| 6,362,525 | B1 | 3/2002 | Rahim |
| 6,369,447 | B2 | 4/2002 | Mori |
| 6,369,454 | B1 | 4/2002 | Chung |
| 6,373,127 | B1 | 4/2002 | Baudouin et al. |
| 6,377,464 | B1 | 4/2002 | Hashemi et al. |
| 6,380,048 | B1 | 4/2002 | Boon et al. |
| 6,384,472 | B1 | 5/2002 | Huang |
| 6,388,336 | B1 | 5/2002 | Venkateshwaran et al. |
| 6,395,578 | B1 | 5/2002 | Shin et al. |
| 6,399,415 | B1 | 6/2002 | Bayan et al. |
| 6,400,004 | B1 | 6/2002 | Fan et al. |
| 6,410,979 | B2 | 6/2002 | Abe |
| 6,414,385 | B1 | 7/2002 | Huang et al. |
| 6,420,779 | B1 | 7/2002 | Sharma et al. |
| 6,421,013 | B1 | 7/2002 | Chung |
| 6,423,643 | B1 | 7/2002 | Furuhata et al. |
| 6,429,508 | B1 | 8/2002 | Gang |
| 6,437,429 | B1 | 8/2002 | Su et al. |
| 6,444,499 | B1 | 9/2002 | Swiss et al. |
| 6,448,633 | B1 | 9/2002 | Yee et al. |
| 6,452,279 | B2 | 9/2002 | Shimoda |
| 6,459,148 | B1 | 10/2002 | Chun-Jen et al. |
| 6,464,121 | B2 | 10/2002 | Reijnders |
| 6,465,883 | B2 | 10/2002 | Olofsson |
| 6,472,735 | B2 | 10/2002 | Isaak |
| 6,475,646 | B2 | 11/2002 | Park et al. |
| 6,476,469 | B2 | 11/2002 | Huang et al. |
| 6,476,474 | B1 | 11/2002 | Hung |
| 6,482,680 | B1 | 11/2002 | Khor et al. |
| 6,483,178 | B1 | 11/2002 | Chuang |
| 6,492,718 | B2 | 12/2002 | Ohmori |
| 6,495,909 | B2 | 12/2002 | Jung et al. |
| 6,498,099 | B1 | 12/2002 | McClellan et al. |
| 6,498,392 | B2 | 12/2002 | Azuma |
| 6,501,165 | B1 * | 12/2002 | Farnworth et al. ............ 257/686 |
| 6,507,096 | B2 | 1/2003 | Gang |
| 6,507,120 | B2 | 1/2003 | Lo et al. |
| 6,518,089 | B2 | 2/2003 | Coyle |
| 6,525,942 | B2 | 2/2003 | Huang et al. |
| 6,528,893 | B2 | 3/2003 | Jung et al. |
| 6,534,849 | B1 | 3/2003 | Gang |
| 6,545,332 | B2 | 4/2003 | Huang |
| 6,545,345 | B1 | 4/2003 | Glenn et al. |
| 6,552,421 | B2 | 4/2003 | Kishimoto et al. |
| 6,559,525 | B2 | 5/2003 | Huang |
| 6,566,168 | B2 | 5/2003 | Gang |
| 6,580,161 | B2 | 6/2003 | Kobayakawa |
| 6,583,503 | B2 | 6/2003 | Akram et al. |
| 6,585,905 | B1 | 7/2003 | Fan et al. |
| 6,603,196 | B2 | 8/2003 | Lee et al. |
| 6,624,005 | B1 | 9/2003 | DiCaprio et al. |
| 6,627,977 | B1 | 9/2003 | Foster |
| 6,646,339 | B1 | 11/2003 | Ku |
| 6,667,546 | B2 | 12/2003 | Huang et al. |
| 6,677,663 | B1 | 1/2004 | Ku et al. |
| 6,686,649 | B1 | 2/2004 | Matthews et al. |
| 6,696,752 | B2 | 2/2004 | Su et al. |
| 6,700,189 | B2 | 3/2004 | Shibata |
| 6,713,375 | B2 | 3/2004 | Shenoy |
| 6,757,178 | B2 | 6/2004 | Okabe et al. |
| 6,800,936 | B2 | 10/2004 | Kosemura et al. |
| 6,812,552 | B2 | 11/2004 | Islam et al. |
| 6,818,973 | B1 | 11/2004 | Foster |
| 6,838,761 | B2 | 1/2005 | Karnezos |
| 6,858,919 | B2 | 2/2005 | Seo et al. |
| 6,861,288 | B2 | 3/2005 | Shim et al. |
| 6,867,492 | B2 | 3/2005 | Auburger et al. |
| 6,876,068 | B1 | 4/2005 | Lee et al. |
| 6,878,571 | B2 | 4/2005 | Isaak et al. |
| 6,897,552 | B2 | 5/2005 | Nakao |
| 6,906,416 | B2 | 6/2005 | Karnezos |
| 6,927,478 | B2 | 8/2005 | Paek |
| 6,933,598 | B2 | 8/2005 | Karnezos |
| 6,946,323 | B1 | 9/2005 | Heo |
| 6,967,125 | B2 | 11/2005 | Fee et al. |
| 6,972,481 | B2 | 12/2005 | Karnezos |
| 6,995,459 | B2 | 2/2006 | Lee et al. |
| 7,002,805 | B2 | 2/2006 | Lee et al. |
| 7,005,327 | B2 | 2/2006 | Kung et al. |
| 7,015,571 | B2 | 3/2006 | Chang et al. |
| 7,034,387 | B2 | 4/2006 | Karnezos |
| 7,045,396 | B2 | 5/2006 | Crowley et al. |
| 7,045,887 | B2 | 5/2006 | Karnezos |
| 7,049,691 | B2 | 5/2006 | Karnezos |
| 7,053,469 | B2 | 5/2006 | Koh et al. |
| 7,053,476 | B2 | 5/2006 | Karnezos |
| 7,053,477 | B2 | 5/2006 | Karnezos |
| 7,057,269 | B2 | 6/2006 | Karnezos |
| 7,061,088 | B2 | 6/2006 | Karnezos |
| 7,064,426 | B2 | 6/2006 | Karnezos |
| 7,075,816 | B2 | 7/2006 | Fee et al. |
| 7,101,731 | B2 | 9/2006 | Karnezos |
| 7,102,209 | B1 | 9/2006 | Bayan et al. |
| 7,109,572 | B2 | 9/2006 | Fee et al. |
| 7,166,494 | B2 | 1/2007 | Karnezos |
| 7,169,642 | B2 | 1/2007 | Karnezos |
| 7,185,426 | B1 | 3/2007 | Hiner et al. |
| 7,193,298 | B2 | 3/2007 | Hong et al. |
| 7,202,554 | B1 | 4/2007 | Kim et al. |
| 7,205,647 | B2 | 4/2007 | Karnezos |

| Patent No. | Date | Inventor |
|---|---|---|
| 7,211,471 B1 | 5/2007 | Foster |
| 7,245,007 B1 | 7/2007 | Foster |
| 7,247,519 B2 | 7/2007 | Karnezos |
| 7,253,503 B1 | 8/2007 | Fusaro et al. |
| 7,253,511 B2 | 8/2007 | Karnezos et al. |
| 7,271,496 B2 | 9/2007 | Kim |
| 7,279,361 B2 | 10/2007 | Karnezos |
| 7,288,434 B2 | 10/2007 | Karnezos |
| 7,288,835 B2 | 10/2007 | Yim et al. |
| 7,298,037 B2 | 11/2007 | Yim et al. |
| 7,298,038 B2 | 11/2007 | Filoteo, Jr. et al. |
| 7,306,973 B2 | 12/2007 | Karnezos |
| 7,312,519 B2 | 12/2007 | Song et al. |
| 2001/0008305 A1 | 7/2001 | McClellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |
| 2003/0168719 A1 | 9/2003 | Cheng et al. |
| 2003/0198032 A1 | 10/2003 | Collander et al. |
| 2004/0027788 A1 | 2/2004 | Chiu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |
| 2004/0080025 A1 | 4/2004 | Kasahara et al. |
| 2004/0089926 A1 | 5/2004 | Hsu et al. |
| 2004/0164387 A1 | 8/2004 | Ikenaga et al. |
| 2004/0253803 A1 | 12/2004 | Tomono et al. |
| 2005/0184377 A1* | 8/2005 | Takeuchi et al. ............... 257/686 |
| 2006/0087020 A1 | 4/2006 | Hirano et al. |
| 2006/0157843 A1 | 7/2006 | Hwang |
| 2006/0231928 A1* | 10/2006 | Dotta et al. .................... 257/621 |
| 2006/0231939 A1 | 10/2006 | Kawabata et al. |
| 2007/0023202 A1 | 2/2007 | Shibata |
| 2007/0152313 A1* | 7/2007 | Periaman et al. ............. 257/686 |
| 2008/0142941 A1* | 6/2008 | Yew et al. ...................... 257/686 |
| 2008/0230887 A1 | 9/2008 | Sun et al. |
| 2008/0272465 A1* | 11/2008 | Do et al. ........................ 257/620 |
| 2009/0057918 A1* | 3/2009 | Kim ............................... 257/777 |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 652333 | 9/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| JP | 2003243595 | 8/2003 |
| JP | 2004158753 | 6/2004 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

PACKAGE IN PACKAGE SEMICONDUCTOR DEVICE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor devices, and more particularly to a package-in-package (PIP) semiconductor device having optimized electrical signal paths to provide enhanced electrical performance.

2. Description of the Related Art

Package-in-package (PIP) semiconductor devices are currently known and used in the electrical arts. A typical PIP semiconductor device comprises various combinations of electronic components including passive devices, semiconductor dies, semiconductor packages, and/or other elements which are arranged in a horizontal direction, or stacked in a vertical direction on an underlying substrate. In many PIP devices, the substrate and the electronic components are interconnected to one another through the use of conductive wires alone or in combination with conductive bumps, with such electronic components thereafter being encapsulated by a suitable encapsulant material which hardens into a package body of the PIP device.

In typical PIP devices, a large number of conductive wires are needed to facilitate the electrical connection of the electronic components to each other and to the substrate in a prescribed pattern or arrangement. In the currently known PIP device configurations, and particularly those in which the electronic components are vertically stacked (i.e., extend perpendicularly relative to the substrate), the electrical signal paths in the PIP device are inevitably lengthened, thus resulting in a deterioration in the electrical performance of the PIP device. Further, the use of a large number of conductive wires leads to a high probability of shorting between the conductive wires in the encapsulation step described above as used to form the package body of the PIP device. Still further, in the event an increased number of electronic components are included in the PIP device, the design of the electrically conductive patterns on the substrate as needed to accommodate the conductive wires can be highly complex, thus adding to the difficulty in the fabrication of the PIP device and increasing the cost thereof. The present invention addresses these and other shortcomings of prior art PIP devices, as will be described in more detail below.

BRIEF SUMMARY OF THE INVENTION

In accordance with the present invention, there is provided multiple embodiments of a package-in-package semiconductor device including shortened electrical signal paths to optimize electrical performance. In each embodiment, the semiconductor device comprises a substrate having a conductive pattern formed thereon. In certain embodiments, a semiconductor package and one or more semiconductor dies are vertically stacked upon the substrate, and placed into electrical communication with the conductive pattern thereof. One or more of the semiconductor dies may include through-silicon vias formed therein for facilitating the electrical connection thereof to the conductive pattern of the substrate or to other electronic components within the vertical stack. Similarly, the semiconductor package may be provided with through-mold vias to facilitate the electrical connection thereof to other electronic components within the vertical stack. In other embodiments of the present invention, a semiconductor die which is electrically connected to the conductive pattern of the substrate is encapsulated with an inner package body which itself is formed to include through-mold vias used to facilitate the electrical connection thereof to another semiconductor die stacked thereon. In each embodiment of the semiconductor device, the vertically stacked electronic components thereof may be covered with a package body which also partially covers the substrate.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
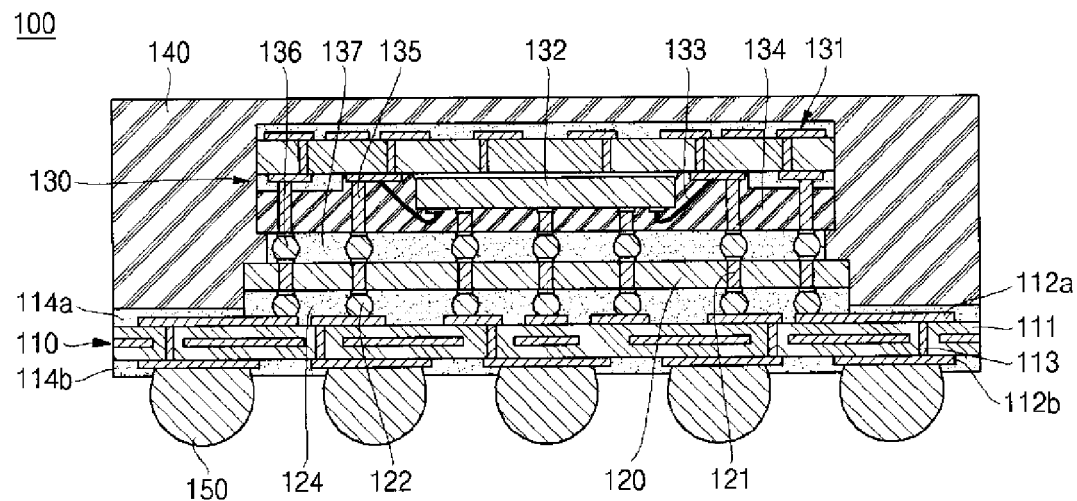
FIG. 1 is a cross-sectional view of a package-in-package semiconductor device constructed in accordance with a first embodiment of the present invention.

Referring now to the drawings wherein the showings are for purposes of illustrating various embodiments of the present invention and not for purposes of limiting the same, FIG. 1 depicts in cross-section a package-in-package semiconductor device 100 constructed in accordance with a first embodiment of the present invention. The semiconductor device 100 comprises a substrate 110 which preferably has a generally quadrangular configuration. The substrate 110 can be selected from common circuit boards (e.g., rigid circuit boards and flexible circuit boards) and equivalents thereof. In this regard, the present invention is not intended to be limited to any particular type of substrate 110. By way of example and not by way of limitation, the substrate 110 may include an insulating layer 111 having opposed, generally planar top and bottom surfaces. Disposed on the top surface is an electrically conductive pattern 112a, while disposed on the bottom surface is an electrically conductive pattern 112b. The conductive patterns 112a, 112b are electrically interconnected to each other in a prescribed pattern or arrangement through the use of conductive vias 113 which extend through the insulation layer 111 in a direction generally perpendicularly between the top and bottom surfaces thereof. A solder mask 114a is preferably coated on at least portions of the conductive pattern 112a and the top surface of the insulating layer 111. Similarly, a solder mask 114b is preferably coated on at least portions of the conductive pattern 112b and the bottom surface of the insulating layer 111. The solder masks 114a, 114b are used to protect portions of the conductive patterns 112a, 112b which would otherwise be exposed to the ambient environment. Those of ordinary skill in the art will recognize that the substrate 110 may alternatively comprise a multi-layer circuit board wherein the conductive patterns 112, 112b are formed inside the insulating layer 111.

The semiconductor device 100 further comprises a first (bottom) semiconductor die 120 which is electrically connected to the substrate 110, and in particular to the conductive pattern 112a thereof. The first semiconductor die 120 has a plurality of through-silicon vias 121 penetrating therethrough in a generally vertical direction as viewed from the perspective shown in FIG. 1. The vias 121 are formed in the first semiconductor die 120 through the use of, for example, a laser or an etching solution. After being formed in the first semiconductor die 120, each of the vias 121 is filled with a conductive material such as copper, aluminum, gold, silver, soldering materials, or equivalents thereto. As seen in FIG. 1, each of the vias 121 is electrically connected to the conductive pattern 112a of the substrate 110 through the use of respective ones of a plurality of conductive bumps 122. Examples of suitable materials for the conductive bumps 122 include, but are not limited to, gold, silver, soldering materials or equivalents thereto. In the semiconductor device 100, an underfill material 124 is preferably filled between the first semiconductor die 120 and the substrate 110. More particularly, as seen in FIG. 1, the underfill material 124 is disposed between the bottom surface of the first semiconductor die 120 and the top surface of the insulating layer 111, the underfill material 124 also covering portions of the conductive pattern 112a and the conductive bumps 122. The underfill material 124 serves to firmly fix the first semiconductor die 120 to the substrate 110. This fixation prevents mechanical separation of the first semiconductor die 120 from the substrate 110 which could otherwise be caused due to differences in the coefficients of thermal expansion therebetween.

The semiconductor device 100 further comprises a semiconductor package 130 which is electrically connected to the first semiconductor die 120. The semiconductor package 130 comprises an inner substrate 131 which includes an insulating layer defining opposed top and bottom surfaces and electrically conductive patterns formed on respective ones of the opposed top and bottom surfaces of the insulating layer. In the inner substrate 131, the conductive patterns disposed on respective ones of the opposed top and bottom surfaces of the insulating layer are electrically connected to each other in a prescribed pattern or arrangement through the use of vias which extend through the insulating layer. The inner substrate 131 of the semiconductor package 130 can itself be selected from rigid circuit boards, flexible circuit boards and equivalents thereto, with the structure of the inner substrate 131 preferably being the same as that of the substrate 110 described above. Attached to the insulating layer of the inner substrate 131 is an inner semiconductor die 132. In the semiconductor package 130, the inner semiconductor die 132 is electrically connected to the conductive patterns of the inner substrate 131 through the use of inner conductive wires 133 which underlie the inner substrate 131 when viewed from the perspective shown in FIG. 1. The inner semiconductor die 132, the inner conductive wires 133, and a portion of the inner substrate 131 are covered by an inner package body 134, the side surfaces of which extend in generally flush relation to the side surfaces of the inner substrate 131. As shown in FIG. 1, that surface of the inner substrate 131 opposite that partially covered by the inner package body 134 may itself be covered with a solder mask which is applied thereto.

In the semiconductor package 130 of the semiconductor device 100, the inner package body 134 has a plurality of through-mold vias 135 formed therein. Each of the vias 135 extends from that surface of the inner package body 134 disposed furthest from the inner substrate 131 to a portion of that conductive pattern formed on the surface of the insulating layer of the inner substrate 131 to which the inner semiconductor die 132 is attached. The vias 135 are preferably formed through the use of a laser or an etching solution, and are each filled with a conductive material selected from copper, aluminum, gold, silver, soldering materials or equivalents thereto.

In the semiconductor device 100, each of the vias 135 is electrically connected to a respective one of the vias 121 through the use of respective ones of a plurality of conductive bumps 136. The conductive bumps 136 may be made of the same conductive materials described above in relation to the conductive bumps 122. As further seen in FIG. 1, an underfill material 137 may be filled between the semiconductor package 130 and the first semiconductor die 120, such underfill material 137 covering the conductive bumps 136. The underfill material 137 serves to firmly fix the semiconductor package 130 to the first semiconductor die 120, with such fixation preventing mechanical separation of the semiconductor package 130 from the first semiconductor die 120 as could otherwise result from differences in the coefficients of thermal expansion therebetween.

In the semiconductor device 100, at least portions of the first semiconductor die 120, the semiconductor package 130, the solder mask 114a, the underfill material 124, the underfill material 137, and the solder mask (if any) applied to the inner substrate 131 are each encapsulated or covered by an encapsulant material which ultimately hardens into a package body 140 of the semiconductor device 100. The present invention is not intended to be limited to any specific material which could be used to facilitate the fabrication of the package body 140. For example, and not by way of limitation, the package body 140 can be formed from epoxy molding compounds or equivalents thereto. The fully formed package body 140 preferably includes side surfaces which extend in generally flush or co-planar relation to respective side surfaces of the insulating layer 111 of the substrate 110.

The semiconductor device 100 further comprises a plurality of solder balls 150 which are electrically connected to the conductive pattern 112b of the substrate 110 in a prescribed pattern or arrangement. As seen in FIG. 1, the solder mask 114b extends into contact with the solder balls 150. Examples of suitable materials for the solder balls 150 include, but are not limited to, eutectic solders (e.g., Sn37Pb), high-lead solders (e.g., Sn95Pb) having a high melting point, lead-free solders (e.g., SnAg, SnCu, SnZn, SnZnBi, SnAgCu and SnAgBi), or equivalents thereto.

The semiconductor device 100 constructed in accordance with the present invention is configured such that the first semiconductor die 120 is electrically interconnected to the semiconductor package 130 through the use of the vias 121, the vias 135 and the conductive bumps 122, 136, rather than through the use of conductive wires. With this particular configuration, the electrical signal paths between the first semiconductor die 120 and the semiconductor package 130 are shortened to achieve improved electrical performance, in addition to providing the semiconductor device 100 with a desired reduced size and thickness.

Figure 2:
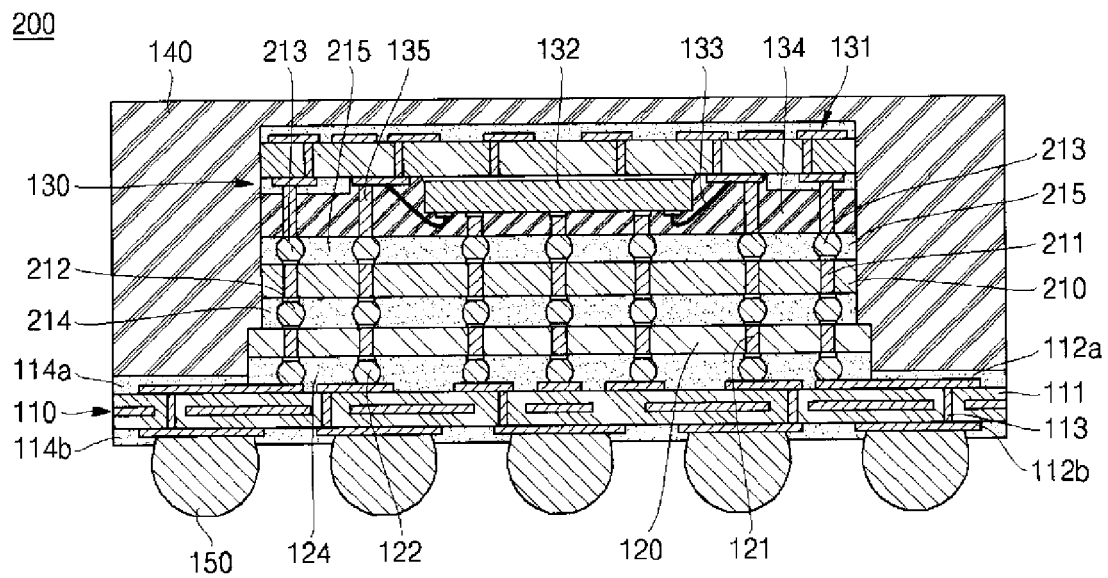
FIG. 2 is a cross-sectional view of a package-in-package semiconductor device constructed in accordance with a second embodiment of the present invention.

Referring now to FIG. 2, there is shown a semiconductor device 200 constructed in accordance with a second embodiment of the present invention. The semiconductor device 200 is substantially similar to the above-described semiconductor device 100, with only the differences between the semiconductor devices 200, 100 being described below.

The sole distinction between the semiconductor devices 200, 100 lies in the addition of a second (middle) semiconductor die 210 to the semiconductor device 200. The second semiconductor die 210 is identically configured to the first semiconductor die 120, and includes a plurality of through-silicon vias 211 formed therein. Each of the vias 211 of the second semiconductor die 210 is filled with a conductive material in the same manner as the vias 121 of the first semiconductor die 120. Additionally, as seen in FIG. 2, the vias 211 of the second semiconductor die 210 are electrically connected to respective ones of the vias 121 of the first semiconductor die 120 through the use of respective ones of a plurality of conductive bumps 212. The conductive bumps 112 are preferably made of the same material described above in relation to the conductive bumps 122, 136. In the semiconductor device 200, an underfill material 214 can be filled between the first and second semiconductor dies 120, 210, the underfill material 214 thus covering or encapsulating the conductive bumps 212. The underfill material 214 serves to firmly fix the second semiconductor die 210 to the first semiconductor die 120, with such fixation preventing mechanical separation of the second semiconductor die 210 from the first semiconductor die 120 as could otherwise result from differences in the coefficients of thermal expansion therebetween.

In the semiconductor device 200, the vias 135 of the semiconductor package 130 are electrically connected to respective ones of the vias 211 of the second semiconductor die 210 through the use of respective ones of a plurality of conductive bumps 213. The conductive bumps 213 are preferably made of the same material used in relation to the conductive bumps 212, and hence the conductive bumps 122, 136. An underfill material 215 can also be filled between the semiconductor package 130 and the second semiconductor die 210, such underfill material 215 thus covering or encapsulating the conductive bumps 213. The underfill material 215 serves to firmly fix the semiconductor package 130 to the second semiconductor die 210, with such fixation preventing mechanical separation of the semiconductor package 130 from the second semiconductor die 210 as could otherwise result from differences in the coefficients of thermal expansion therebetween. Thus, based on the foregoing, the conductive bumps 213 minor the functionality of the aforementioned conductive bumps 136, with the underfill material 215 mirroring the functionality of the aforementioned underfill material 137. As will be recognized, in the semiconductor device 200, the package body 140 further covers at least portions of the second semiconductor die 210 and the underfill material 214, 215, in addition to those features described above in relation to the semiconductor device 100.

Similar to the semiconductor device 100, the semiconductor device 200 is configured such that the first and second semiconductor dies 120, 210 are stacked between and electrically interconnected to the substrate 110 and the semiconductor package 130. With this configuration, the integration of the semiconductor device 200 can be increased, while exhibiting improved electrical performance.

Figure 3:
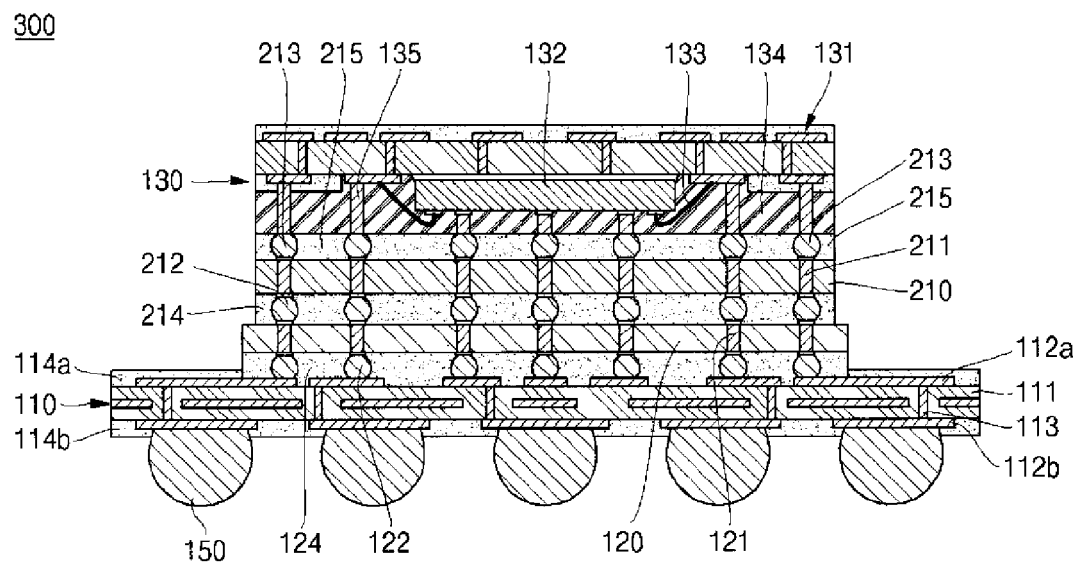
FIG. 3 is a cross-sectional view of a package-in-package semiconductor device constructed in accordance with a third embodiment of the present invention.

Referring now to FIG. 3, there is shown a semiconductor device 300 constructed in accordance with a third embodiment of the present invention. The semiconductor device 300 is substantially similar to the above-described semiconductor device 200, with only the differences between the semiconductor devices 300, 200 being described below.

The sole distinction between the semiconductor devices 300, 200 lies in the omission of the package body 140 in the semiconductor device 300. As a result, in the semiconductor device 300, the first and second semiconductor dies 120, 210, as well as the semiconductor package 130, are each exposed. With this particular configuration, the semiconductor device 300 is able to exhibit improved heat sink performance in comparison to the semiconductor device 200.

Figure 4:
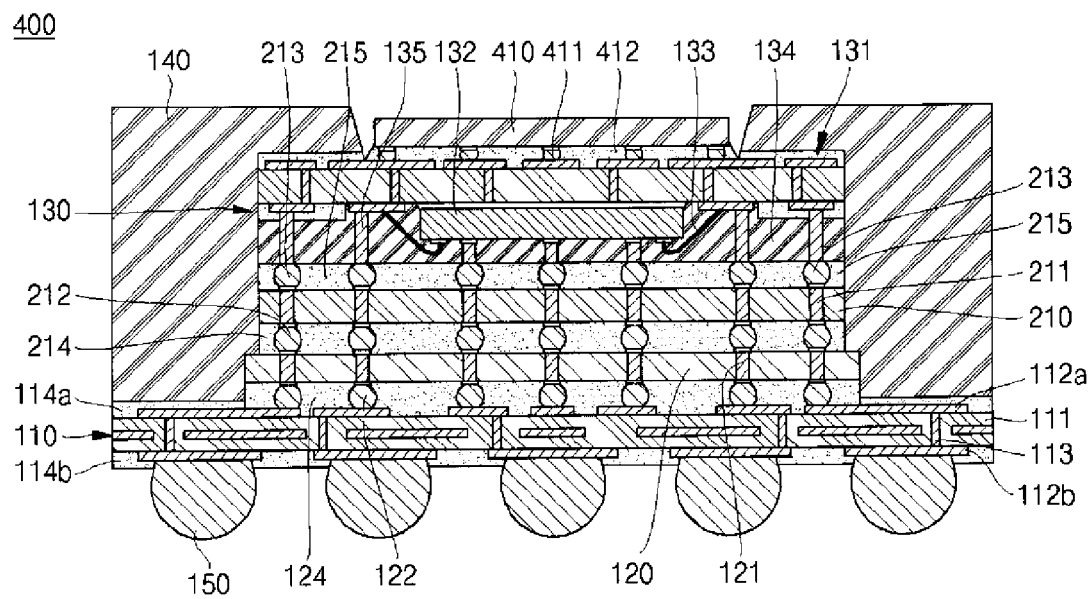
FIG. 4 is a cross-sectional view of a package-in-package semiconductor device constructed in accordance with a fourth embodiment of the present invention.

Referring now to FIG. 4, there is shown a semiconductor device 400 constructed in accordance with a fourth embodiment of the present invention. The semiconductor device 400 is also substantially similar to the above-described semiconductor device 200, with only the differences between the semiconductor devices 400, 200 being described below.

The primary distinction between the semiconductor devices 400, 200 lies in the addition of a third (top) semiconductor die 410 to the semiconductor device 400. More particularly, as seen in FIG. 4, the third semiconductor die 410 is electrically connected to one of the conductive patterns of the inner substrate 131 of the semiconductor package 130 through the use of conductive bumps 411. The conductive bumps 411 are preferably made of the same material as the conductive bumps 122, 212, 213. An underfill material 412 can be filled between the third semiconductor die 410 and the inner substrate 131, such underfill material 412 thus covering or encapsulating the conductive bumps 411 and further covering portions of that conductive pattern of the inner substrate 131 to which the conductive bumps 411 are electrically connected. The underfill material 412 is used to prevent the mechanical separation of the third semiconductor die 410 from the semiconductor package 130 as could otherwise result due to differences in the coefficients of thermal expansion therebetween.

As further seen in FIG. 4, in the semiconductor device 400, the structural attributes of the package body 140 are preferably modified in comparison to the package body 140 of the semiconductor device 300, the package body 140 of the semiconductor device 400 being configured such that the third semiconductor die 410 is exposed in the semiconductor device 400. More particularly, as seen in FIG. 4, the third semiconductor die 410 is exposed within a recess formed within the top surface of the package body 140. The exposure of the third semiconductor die 410 within the semiconductor device 400 results in the improved heat sink performance of the third semiconductor die 410.

The semiconductor device 400 is configured such that the third semiconductor die 410 is disposed on and electrically interconnected to the semiconductor package 130. With this configuration, the integration of the semiconductor device 400 can be increased while exhibiting improved electrical and heat dissipation performance.

Figure 5:
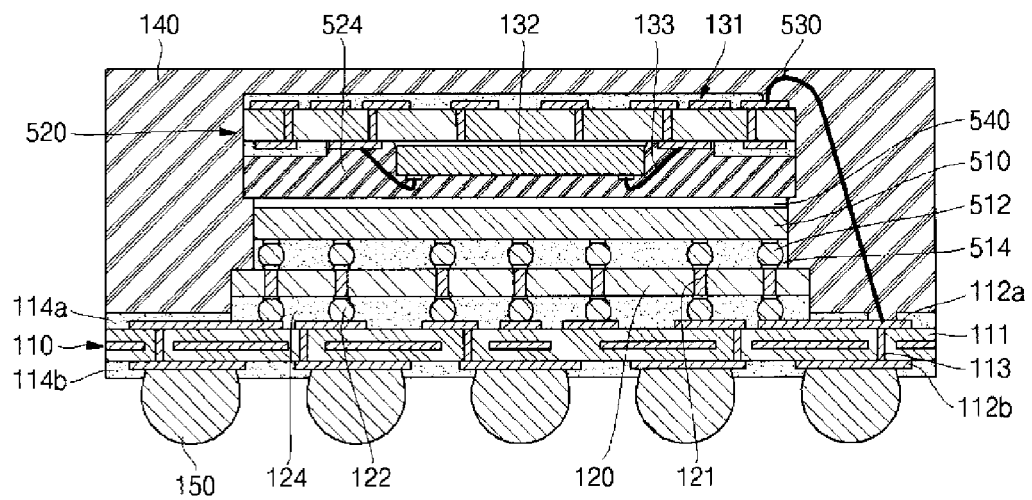
FIG. 5 is a cross-sectional view of a package-in-package semiconductor device constructed in accordance with a fifth embodiment of the present invention.

Referring now to FIG. 5, there is shown a semiconductor device 500 constructed in accordance with a fifth embodiment of the present invention. The semiconductor device 500 comprises the substrate 110 and the first semiconductor die 120 described above in relation to the semiconductor device 100. In the semiconductor device 500, the first substrate 110 and the first semiconductor die 120 are electrically connected to each other through the use of conductive bumps 122 in the same manner described above in relation to the semiconductor device 100. Similarly, in the semiconductor device 500, the underfill material 134 is interposed between the first semiconductor die 120 and the substrate 110, and the solder balls 150 are electrically connected to the substrate 110, in the same manner also described above in relation to the semiconductor device 100.

The semiconductor device 500 further comprises a second (middle) semiconductor die 510 which includes a plurality of conductive contacts or terminals disposed on the bottom surface thereof. These terminals of the second semiconductor die 510 are electrically connected to respective ones of the vias 121 of the first semiconductor die 120 through the use of respective ones of a plurality of conductive bumps 512. The conductive bumps 512 are preferably made of the same material used in relation to the conductive bumps 122. An underfill material 514 can be filled between the first and second semiconductor dies 120, 510, the underfill material 514 thus covering or encapsulating the conductive bumps 512. The underfill material 514 serves to firmly fix the second semiconductor die 510 to the first semiconductor die 120, with such fixation preventing mechanical separation of the second semiconductor die 510 from the first semiconductor die 120 as could otherwise result from differences in the coefficients of thermal expansion therebetween. In contrast to the second semiconductor die 210 described above in relation to the semiconductor device 200, the second semiconductor die 512 of the semiconductor device 500 does not include any through-silicon vias formed therein.

The semiconductor device 500 further comprises a semiconductor package 520 which is substantially similar to the semiconductor package 130 described above in relation to the semiconductor devices 100, 200, 300, 400. In this regard, the sole distinction between the semiconductor packages 520, 130 lies in the package body 524 of the semiconductor package 520 not including the above-described through-mold vias 135 filled with the conductive metal material. Thus, in the semiconductor device 500, that surface of the package body 524 of the semiconductor package 520 disposed furthest from the inner substrate 131 thereof is attached to the top surface of the second semiconductor die 510. However, the semiconductor package 520 is not in direct electrical communication with the second semiconductor die 510. The attachment of the semiconductor package 520 to the second semiconductor die 510 is preferably facilitated by an adhesive layer 540 which is interposed therebetween.

Due to the absence of a direct electrical connection between the semiconductor package 520 and the second semiconductor die 510 as indicated above, in the semiconductor device 500, the semiconductor package 520 is electrically connected to the substrate 110 through the use of at least one conductive wire 530 which is covered or encapsulated by the package body 140. More particularly, as seen in FIG. 5, one end of the conductive wire 130 is electrically connected to that conductive pattern or the inner substrate 131 which is disposed on that surface of the insulating layer thereof opposite the surface to which the inner semiconductor die 132 is mounted. The opposite end of the conductive wire 530 is electrically connected to the conductive pattern 112a disposed on the top surface of the insulating layer 111 of the substrate 110.

Figure 6:
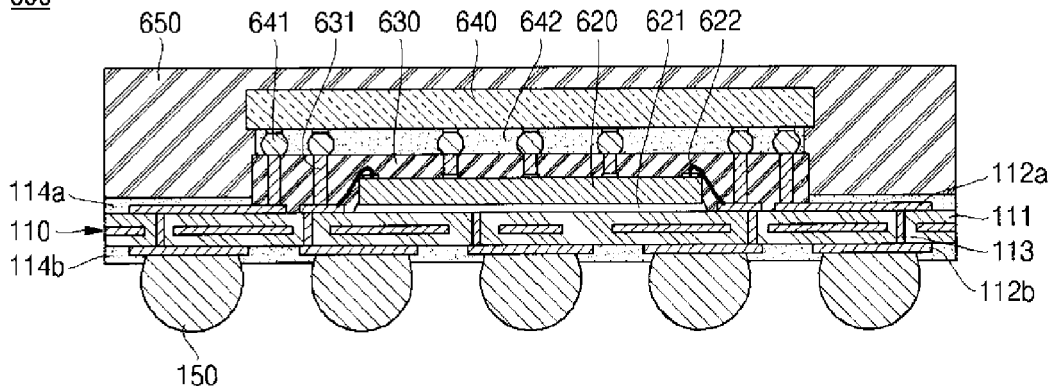
FIG. 6 is a cross-sectional view of a package-in-package semiconductor device constructed in accordance with a sixth embodiment of the present invention.

Referring now to FIG. 6, there is shown a semiconductor device 600 constructed in accordance with a sixth embodiment of the present invention. The semiconductor device 600 comprises the substrate 110 and solder balls 150 which possess the same structural attributes and are electrically connected to each other in the same manner described above in relation to the semiconductor device 100. In the semiconductor device 600, a first (bottom) semiconductor die 620 is attached to the top surface of the insulating layer 111 of the substrate 110 through the use of an adhesive layer 621. Certain contacts or terminals disposed on the top surface of the first semiconductor die 620 are also electrically connected to the conductive pattern 112a disposed on the top surface of the insulating layer 111 through the use of conductive wires 622.

In the semiconductor device 600, the first semiconductor die 620, the conductive wires 622, a portion of the top surface of the insulating layer 111 of the substrate 110, and portions of the conductive pattern 112a are covered by an encapsulant material which hardens into an inner package body 630 of the semiconductor device 600. The inner package body 630 includes a plurality of through-mold vias 631 formed therein. Some of the vias 631 extend from that surface of the inner package body 630 disposed furthest from the substrate 110 to a portion of the conductive pattern 112a. Other vias 631 extend from that surface of the inner package body 630 disposed furthest from the substrate 110 to respective ones of the terminals on the top surface of the first semiconductor die 620. The vias 631 are preferably formed through the use of a laser or an etching solution, and are each filled with a conductive material selected from copper, aluminum, gold, silver, soldering materials or equivalents thereto.

The semiconductor device 600 further comprises a second (top) semiconductor die 640. The second semiconductor die 640 includes a plurality of conductive contacts or terminals disposed on the bottom surface thereof which are electrically connected to respective ones of the vias 631 through the use of respective ones of a plurality of conductive bumps 641. The conductive bumps 641 are preferably made of the same material described above in relation to the conductive bumps 122, 136 of the semiconductor device 100. As seen in FIG. 6, an underfill material 642 may be filled between the second semiconductor die 640 and the inner package body 630, such underfill material 642 thus covering or encapsulating the conductive bumps 641. The underfill material 642 serves to firmly fix the second semiconductor die 640 to the inner package body 630, with such fixation preventing mechanical separation of the second semiconductor die 640 from the inner package body 630 as could otherwise result from differences in the coefficients of thermal expansion therebetween.

In the semiconductor device 600, at least portions of the second semiconductor die 640, the underfill material 642, the inner package body 630 and the solder mask 114*a* are encapsulated or covered by an encapsulant material which ultimately hardens into a package body 650 of the semiconductor device 600. The present invention is not intended to be limited to any specific material which could be used to facilitate the fabrication of the package body 650. For example, and not by way of limitation, the package body 650 can be formed from epoxy molding compounds or equivalents thereto. The fully formed package body 650 preferably includes side surfaces which extend in generally flush or co-planar relation to respective side surfaces of the insulating layer 111 of the substrate 110.

The semiconductor device 600 is configured such that the overlying second semiconductor die 640 can be electrically interconnected to the underlying first semiconductor die 620 through some of the through-mold vias 631 of the inner package body 630. With this configuration, electrical signal paths between the second and first semiconductor dies 640, 620 are shortened to achieve improved electrical performance, as well as a reduction in the size and thickness of the semiconductor device 600.

Figure 7:
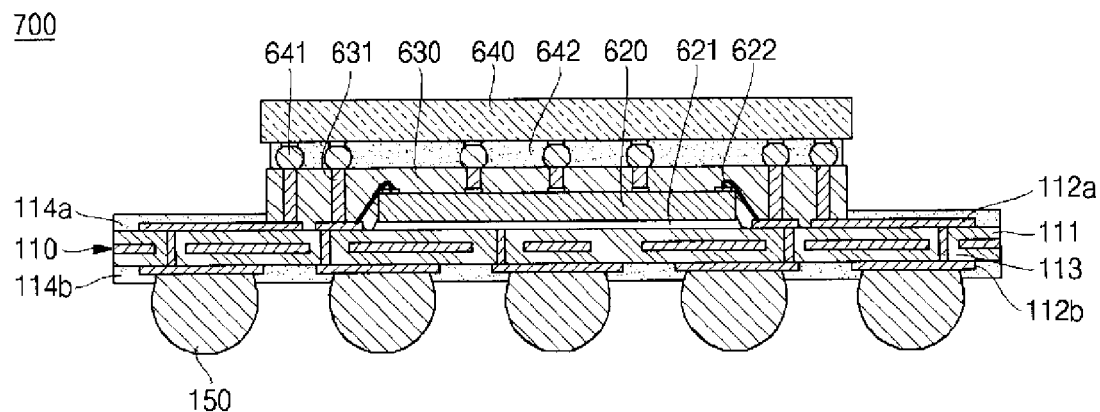
FIG. 7 is a cross-sectional view of a package-in-package semiconductor device constructed in accordance with a seventh embodiment of the present invention.

Referring now to FIG. 7, there is shown a semiconductor device 700 constructed in accordance with a seventh embodiment of the present invention. The semiconductor device 700 is substantially similar to the above-described semiconductor device 600, with only the differences between the semiconductor devices 700, 600 being described below.

The sole distinction between the semiconductor devices 700, 600 lies in the omission of the package body 650 in the semiconductor device 700. As a result, in the semiconductor device 700, the second semiconductor die 640 and the inner package body 630 are each exposed. With this particular configuration, the semiconductor device 700 is able to exhibit improved heat sink performance in comparison to the semiconductor device 600.

Figure 8:
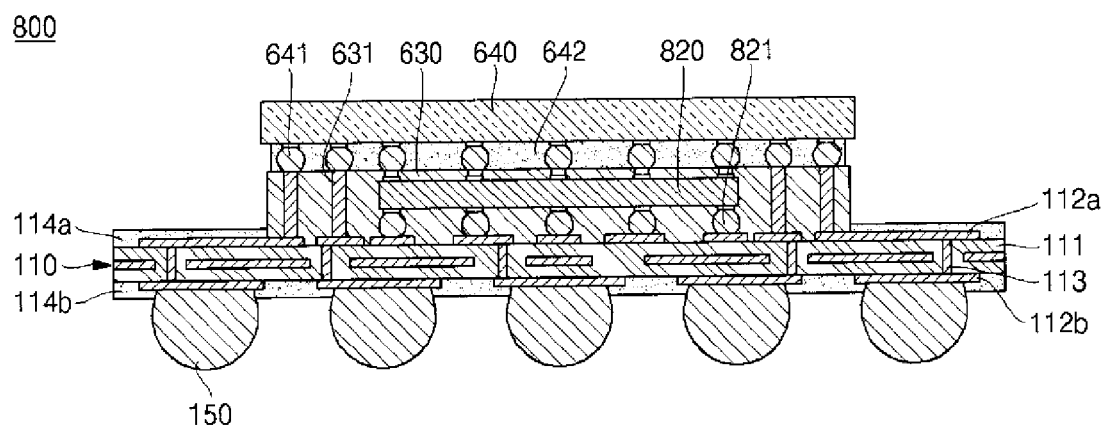
FIG. 8 is a cross-sectional view of a package-in-package semiconductor device constructed in accordance with an eighth embodiment of the present invention.

Referring now to FIG. 8, there is a shown a semiconductor device 800 constructed in accordance with an eighth embodiment of the present invention. The semiconductor device 800 is substantially similar to the above-described semiconductor device 700, with only the differences between the semiconductor devices 800, 700 being described below.

The sole distinction between the semiconductor devices 800, 700 lies in the substitution of the first semiconductor die 620 with a first semiconductor die 820, and the electrical connection of such first semiconductor die 820 to the conductive pattern 112*a* through the use of conductive bumps 821 rather than the above-described conductive wires 622. More particularly, the first semiconductor die 820, in addition to including conductive terminals on the top surface thereof which are electrically connected to respective ones of the conductive bumps 641, also includes conductive terminals on the bottom surface thereof which are electrically connected to the conductive pattern 112*a* through respective ones of the conductive bumps 821. The conductive bumps 821 are preferably fabricated from the same material used to fabricate the conductive bumps 641. Thus, the conductive bumps 821, like the aforementioned conductive wires 622, are each covered or encapsulated by the inner package body 630.

In the semiconductor device 800, the use of the conductive bumps 821 as an alternative to the conductive wires 622 effectively shortens the electrical signal paths between the first semiconductor die 820 and the substrate 110, resulting in an improvement in the electrical performance of the semiconductor device 800 in comparison to the semiconductor device 700.

Figure 9:
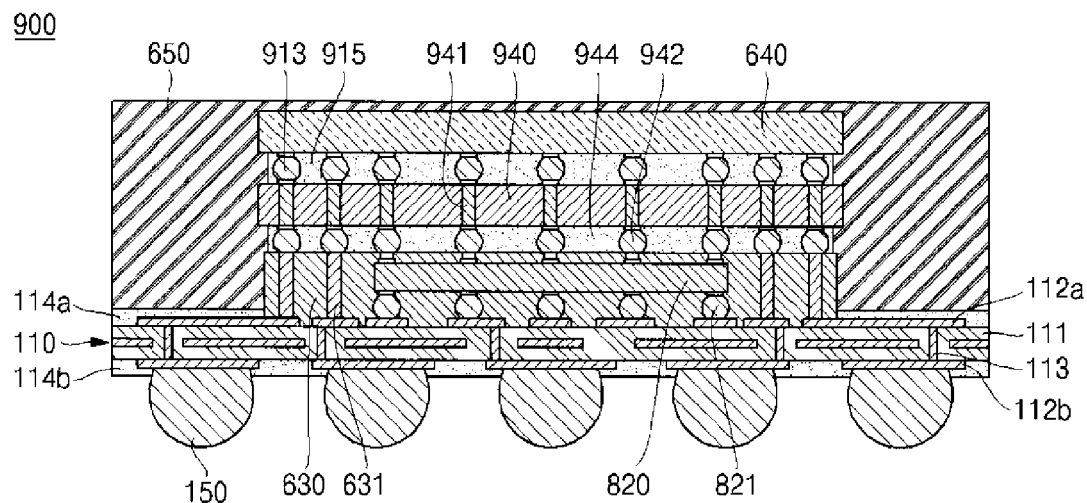
FIG. 9 is a cross-sectional view of a package-in-package semiconductor device constructed in accordance with a ninth embodiment of the present invention.

Referring now to FIG. 9, there is shown a semiconductor device 900 constructed in accordance with a ninth embodiment of the present invention. The semiconductor 900 is similar in structure to the above-described semiconductor device 800, and comprises the substrate 110 and solder balls 150 which possess the same structural attributes and are electrically connected to each other in the same manner described above in relation to the semiconductor device 100. The semiconductor device 900 also includes the first semiconductor die 820 described above in relation to the semiconductor device 800, such first semiconductor die 820 being electrically connected to the substrate 110 through the use of the same conductive bumps 821 also described above in relation to the semiconductor device 800. Also included in the semiconductor device 900 is the inner package body 630 which is identically configured to the inner package body 630 described above in relation to the semiconductor devices 600, 700, 800, and includes the through-mold vias 631 formed therein and electrically connected to both the first semiconductor die 820 and the conductive pattern 112*a* of the substrate 110.

In addition to the aforementioned components common to the semiconductor device 800, the semiconductor device 900 further comprises a third (middle) semiconductor die 940. The third semiconductor die 940 includes a plurality of through-silicon vias 941 penetrating therethrough in a generally vertical direction as viewed from the perspective shown in FIG. 9. The vias 941 are formed in the third semiconductor die 940 through the use of, for example, a laser or an etching solution. After being formed in the third semiconductor die 940, each of the vias 941 is filled with a conductive material such as copper, aluminum, gold, silver, soldering materials, or equivalents thereto. Each of the vias 941 is electrically connected to a respective one of the vias 631 through the use of respective ones of a plurality of conductive bumps 942. Each of the conductive bumps 942 is preferably fabricated from the same material used in relation to the conductive bumps 821. In the semiconductor device 900, an underfill material 944 is preferably filled between the third semiconductor die 940 and the inner package body 630, the underfill material 944 thus covering or encapsulating the conductive bumps 942. The underfill material 944 serves to firmly fix the third semiconductor die 940 to the inner package body 630, with such fixation preventing mechanical separation of the third semiconductor die 940 from the inner package body 630 as could otherwise result from differences in the coefficients of thermal expansion therebetween.

The semiconductor device 900 further comprises the second (top) semiconductor die 640 described above in relation to the semiconductor devices 600, 700, 800. In the semiconductor device 900, the terminals disposed on the bottom surface of the second semiconductor die 640 are electrically connected to respective ones of the vias 941 through the use of respective ones of a plurality of conductive bumps 913. The conductive bumps 913 are preferably fabricated from the same materials used to form the conductive bumps 942, 821. As seen in FIG. 9, an underfill material 915 may be filled between the second and third semiconductor dies 640, 941. More particularly, the underfill material is disposed between the bottom surface of the second semiconductor die 640 and the top surface of the third semiconductor die 940, and thus covers or encapsulates the conductive bumps 913 extending therebetween. The underfill material 915 serves to firmly fix the second and third semiconductor dies 640, 940 to each other, with such fixation preventing mechanical separation of the second semiconductor die 640 from the third semiconductor die 940 as could otherwise result from differences in the coefficients of thermal expansion therebetween.

In the semiconductor device 900, at least portions of the second and third semiconductor dies 640, 940, the underfill material 915, 944, the inner package body 630, and the solder mask 114a are encapsulated or covered by the package body 650 described above in relation to the semiconductor device 600. The fully formed package body 650 of the semiconductor device 900 preferably includes side surfaces which extend in generally flush or co-planar relation to respective side surfaces of the insulating layer 111 of the substrate 110.

The semiconductor device 900 is configured such that the third (middle) semiconductor die 940 is positioned between and electrically interconnected to the first (bottom) semiconductor die 820 and the second (top) semiconductor die 640. With this configuration, the integration of the semiconductor device 900 can be increased while exhibiting improved electrical performance.

Figure 10:
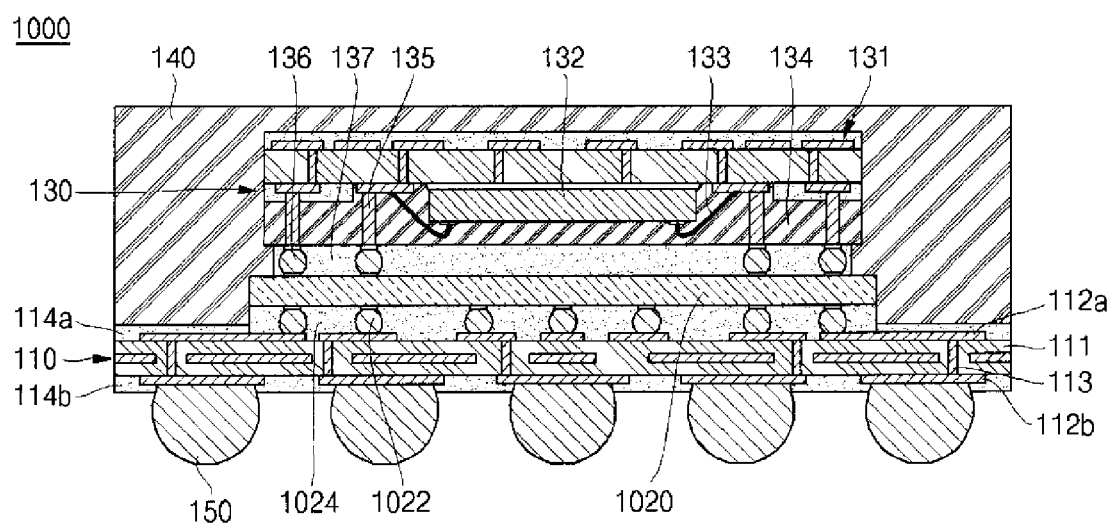
FIG. 10 is a cross-sectional view of a package-in-package semiconductor device constructed in accordance with a tenth embodiment of the present invention.

Referring now to FIG. 10, there is shown a semiconductor device 1000 constructed in accordance with a tenth embodiment of the present invention. The semiconductor device 1000 comprises the substrate 110 and solder balls 150 which possess the same structural attributes and are electrically connected to each other in the same manner described above in relation to the semiconductor device 100. In the semiconductor device 1000, a first (bottom) semiconductor die 1020 is electrically connected to the conductive pattern 112a disposed on the top surface of the insulating layer 111 of the substrate 110. More particularly, the first semiconductor die 1020 includes a plurality of conductive contacts or terminals disposed on respective ones of the opposed top and bottom surfaces thereof. Those terminals disposed on the bottom surface of the first semiconductor die 1020 are electrically connected to the conductive pattern 112a through the use of a plurality of conductive bumps 1022. The conductive bumps 1022 are preferably fabricated from the same material used in relation to the conductive bumps 122 of the semiconductor device 100. An underfill material 1024 can be filled between the first semiconductor die 1020 and the substrate 110. More particularly, as seen in FIG. 10, the underfill material 1024 is disposed between the bottom surface of the first semiconductor die 1020 and the top surface of the insulating layer 111, the underfill material 1024 also covering portions of the conductive pattern 112a and the conductive bumps 1022. The underfill material 1024 serves to firmly fix the first semiconductor die 1020 to the substrate 110. This fixation prevents mechanical separation of the first semiconductor die 1020 from the substrate 110 which could otherwise be caused due to differences in the coefficients of thermal expansion therebetween.

The semiconductor device 1000 further comprises the semiconductor package 130 described above in relation to the semiconductor device 100. In the semiconductor device 1000, the through-mold vias 135 of the semiconductor package 130 are electrically connected to respective ones of the terminals disposed on the top surface of the first semiconductor die 1020 through the use of respective ones of the conductive bumps 136 also described above in relation to the semiconductor device 100. The underfill material 137 also described above in relation to the semiconductor device 100 may be filled between the semiconductor package 130 and the first semiconductor die 1020. More particularly, as seen in FIG. 10, the underfill material 137 is disposed between that surface of the inner package body 134 disposed furthest from the inner substrate 131 and the top surface of the first semiconductor die 1020, the underfill material 137 thus covering or encapsulating the conductive bumps 136. The underfill material 137 serves to firmly fix the semiconductor package 130 to the first semiconductor die 1020, such fixation preventing the mechanical separation of the semiconductor package 130 from the first semiconductor die 1020 which could otherwise be caused due to differences in the coefficients of thermal expansion therebetween.

In the semiconductor device 1000, at least portions of the first semiconductor die 1020, semiconductor package 130, the solder mask 114a, the underfill material 1024, the underfill material 137, and the solder mask (if any) applied to the inner substrate 131 are each encapsulated or covered by the package body 140 described above in relation to the semiconductor device 100. The fully formed package body 140 preferably includes side surfaces which extend in generally flush or co-planar relation to respective side surfaces of the insulating layer 111 of the substrate 110.

Figure 11:
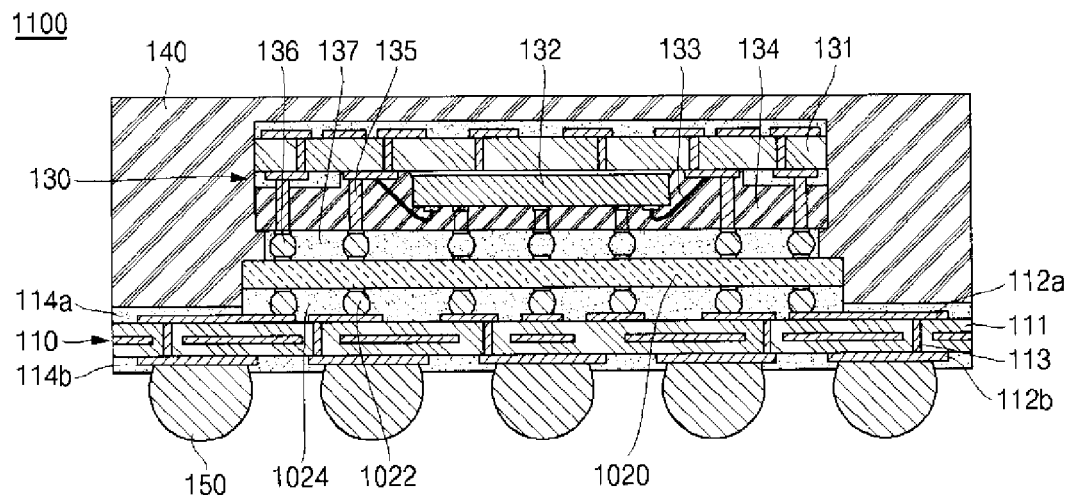
FIG. 11 is a cross-sectional view of a package-in-package semiconductor device constructed in accordance with an eleventh embodiment of the present invention.

Referring now to FIG. 11, there is shown a semiconductor device 1100 constructed in accordance with an eleventh embodiment of the present invention. The semiconductor device 1100 is substantially similar to the above-described semiconductor device 1000, with only the differences between the semiconductor devices 1100, 1000 being described below.

The sole distinction between the semiconductor devices 1100, 100 lies in the inner package body 134 of the semiconductor package 130 included in the semiconductor device 1100 including through-mold vias 135 which, rather than extending only to one of the conductive patterns of the inner substrate 131, also extend to respective ones of the conductive contacts or terminals disposed on the inner semiconductor die 132 in the manner shown in FIG. 11. Each of the vias 135 electrically connected to a respective one of the terminals of the inner semiconductor die 132 is also electrically connected to a respective one of the terminals of the first semiconductor die 1020 via a respective one of the conductive bumps 136.

Figure 12:
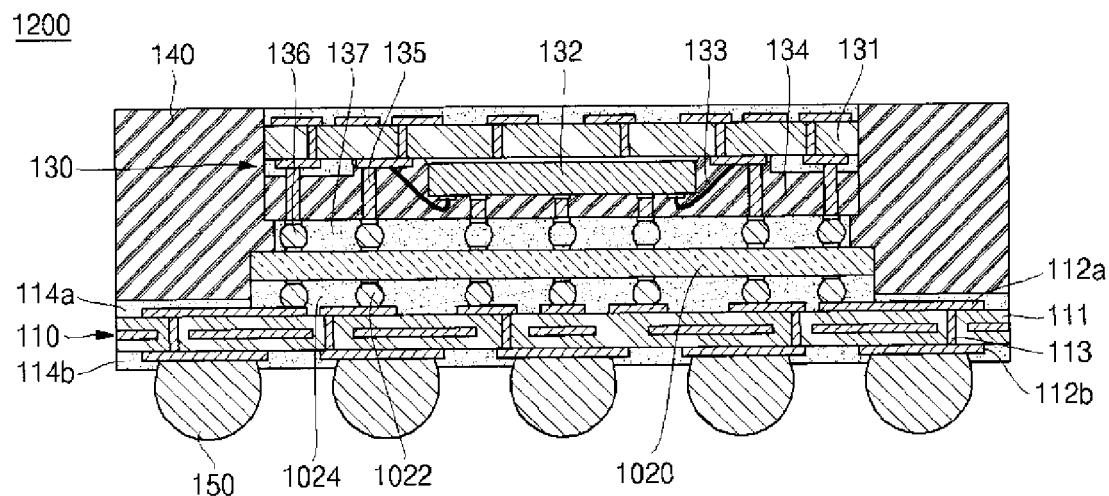
FIG. 12 is a cross-sectional view of a package-in-package semiconductor device constructed in accordance with a twelfth embodiment of the present invention.

Referring now to FIG. 12, there is shown a semiconductor device 1200 constructed in accordance with a twelfth embodiment of the present invention. The semiconductor device 1200 is substantially similar to the above-described semiconductor device 1100, with only the differences between the semiconductor devices 1200, 1100 being described below.

The sole distinction between the semiconductor devices 1200, 1100 lies in the semiconductor package 130 in the semiconductor device 1200 being exposed in the top surface of the package body 140 thereof. With this configuration, the heat sink performance of the semiconductor device 1200 is improved in comparison to the above-described semiconductor device 1000.

Figure 13:
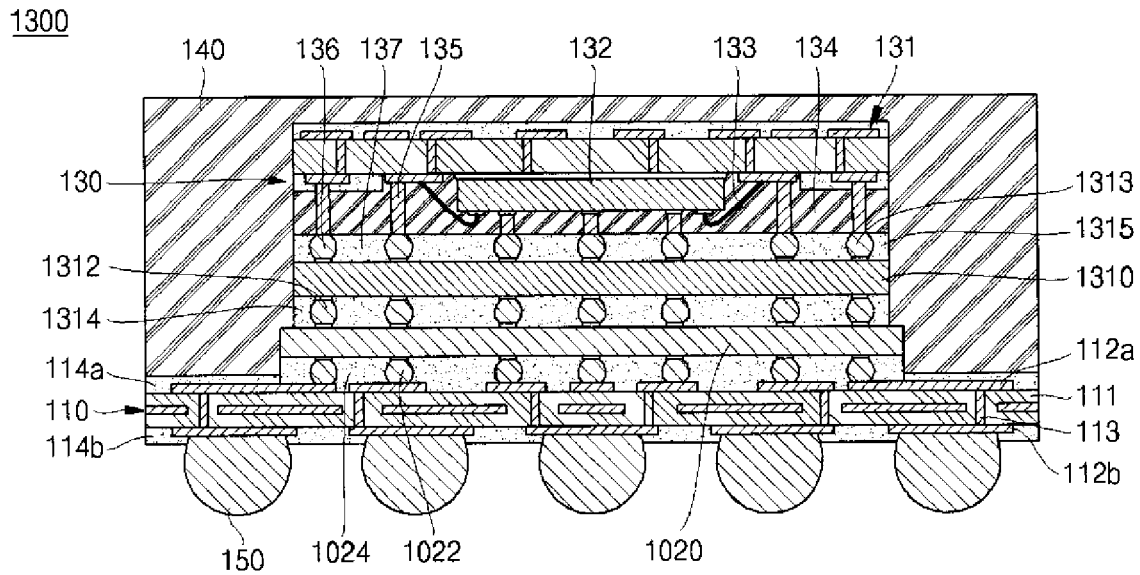
FIG. 13 is a cross-sectional view of a package-in-package semiconductor device constructed in accordance with a thirteenth embodiment of the present invention.

Referring now to FIG. 13, there is shown a semiconductor device 1300 constructed in accordance with a thirteenth embodiment of the present invention. The semiconductor device 1300 is also substantially similar to the above-described semiconductor device 1100, with only the differences between the semiconductor devices 1300, 1100 being described below.

The sole distinction between the semiconductor devices 1300, 1100 lies in the addition of a second (middle) semiconductor die 1310 to the semiconductor device 1300. The second semiconductor die 1310 includes conductive contacts or terminals disposed on respective ones of the opposed top and bottom surfaces thereof. The terminals disposed on the bottom surface of the second semiconductor die 1310 are electrically connected to respective ones of the terminals disposed on the top surface of the first semiconductor die 1020 via respective ones of a plurality of conductive bumps 1312 which are preferably made of the same material as the conductive bumps 1022. An underfill material 1314 can be filled between the first and second semiconductor dies 1020, 1310, and in particular between the top surface of the first semiconductor die 1020 and the bottom surface of the second semiconductor die 1310. The underfill material 1314 thus covers or encapsulates the conductive bumps 1312. The underfill material 1314 serves to firmly fix the second semiconductor die 1310 to the first semiconductor die 1020, with such fixation preventing mechanical separation of the second semiconductor die 1310 from the first semiconductor die 1020 as could otherwise result from differences in the coefficients of thermal expansion therebetween.

In the semiconductor device 1300, the vias 135 of the semiconductor package 130 are electrically connected to respective ones of the terminals disposed on the top surface of the second semiconductor die 1310 through the use of respective ones of a plurality of conductive bumps 1313 which are also each preferably made of the same material used to form the conductive bumps 1022. An underfill material 1315 can be filled between the semiconductor package 130 and the second semiconductor die 1310, the underfill material 1315 thus covering or encapsulating the conductive bumps 1313. The underfill material 1315 serves to firmly fix the semiconductor package 130 to the second semiconductor die 1310, with such fixation preventing mechanical separation of the semiconductor package 130 from the second semiconductor die 1310 as could otherwise result from differences in the coefficients of thermal expansion therebetween.

Figure 14:
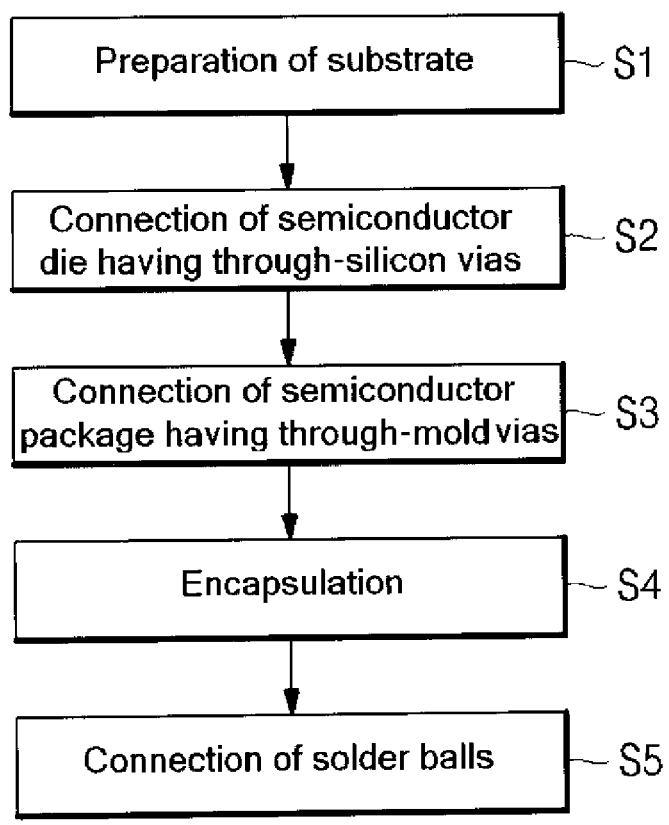
FIG. 14 is a flow chart illustrating an exemplary fabrication method for the package-in-package semiconductor package shown in FIG. 1.

Referring now to FIG. 14, there is provided a flow chart which sets forth an exemplary method for fabricating the semiconductor device 100 of the present invention shown in FIG. 1. The method comprises the steps of preparing the substrate (S1), the connection of the semiconductor die having through-silicon vias (S2), the connection of the semiconductor package having through-mold vias (S3), encapsulation (S4), and the connection of solder balls (S5). FIGS. 15A-15E provide illustrations corresponding to these particular steps, as will be discussed in more detail below.

Figure 15A:
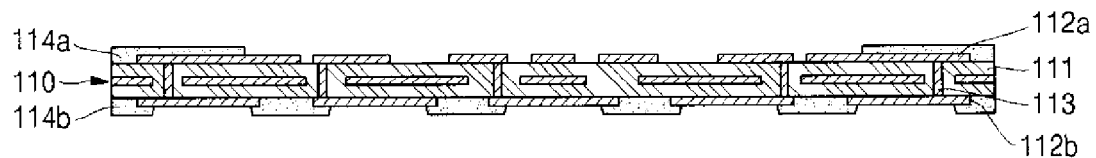
FIGS. 15A-15E are views illustrating an exemplary fabrication method for the package-in-package semiconductor package shown in FIG. 1.
Figure 15B:
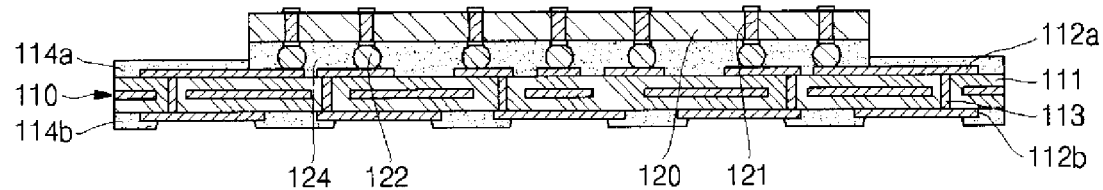

Referring now to FIG. 15A, in the initial step S1 of the fabrication process for the semiconductor device 100, the substrate 110 having the above-described structural attributes is provided. Thereafter, as illustrated in FIG. 15B, step S2 is completed wherein the first semiconductor die 120 having the through-silicon vias 121 is electrically connected to the conductive pattern 112a of the substrate 110 through the use of the conductive bumps 122 in the above-described manner. As also indicated above, the underfill material 124 may be interposed between the first semiconductor die 120 and the substrate 110, such underfill material 124 thus covering or encapsulating the conductive bumps 122.

Figure 15C:
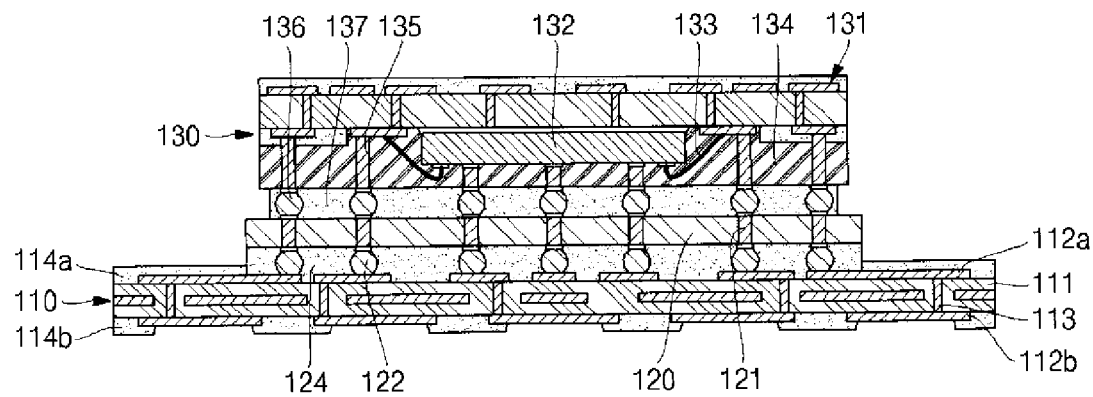

Referring now to FIG. 15C, in the next step S3 of the fabrication process for the semiconductor device 100, the through-mold vias 135 of the semiconductor package 130 are electrically connected to respective ones of the vias 121 of the first semiconductor die 120 through the use of respective ones of the conductive bumps 136 in the above-described manner. As also indicated above, the underfill material 137 may be filled between the semiconductor package 130 and the first semiconductor die 120, such underfill material 137 thus covering or encapsulating the conductive bumps 136.

Figure 15D:
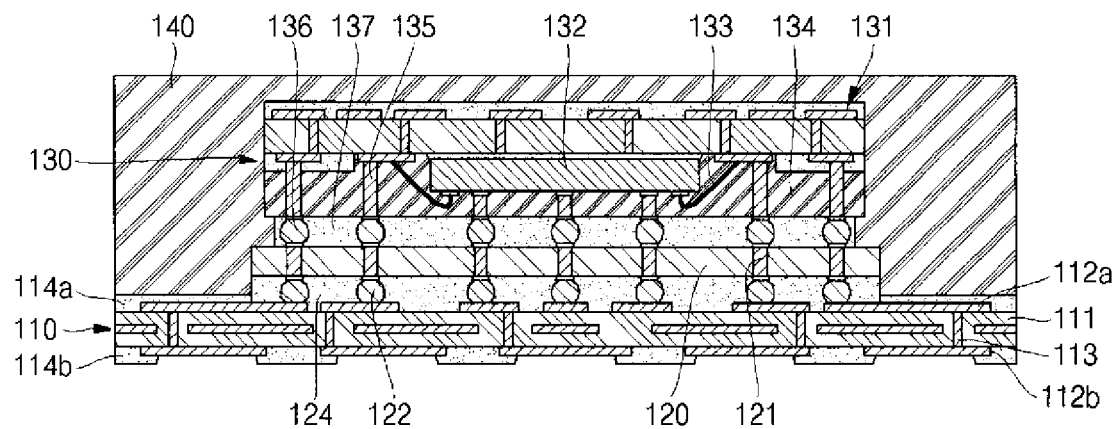

Referring now to FIG. 15D, in the next step S4 of the fabrication process for the semiconductor device 100, at least portions of the first semiconductor die 120, the semiconductor package 130, the solder mask 114a, the underfill material 124, the underfill material 137, and the solder mask (if any) applied to the inner substrate 131 are each encapsulated or covered by an encapsulant material which ultimately hardens into the package body 140 of the semiconductor device 100. As indicated above, the fully formed package body 140 preferably includes side surfaces which extend in generally flush or co-planar to respective side surfaces of the insulating layer 111 of the substrate 110. The encapsulation step S4 can be carried out by transfer molding using a mold or dispensing molding using a dispenser.

Figure 15E:
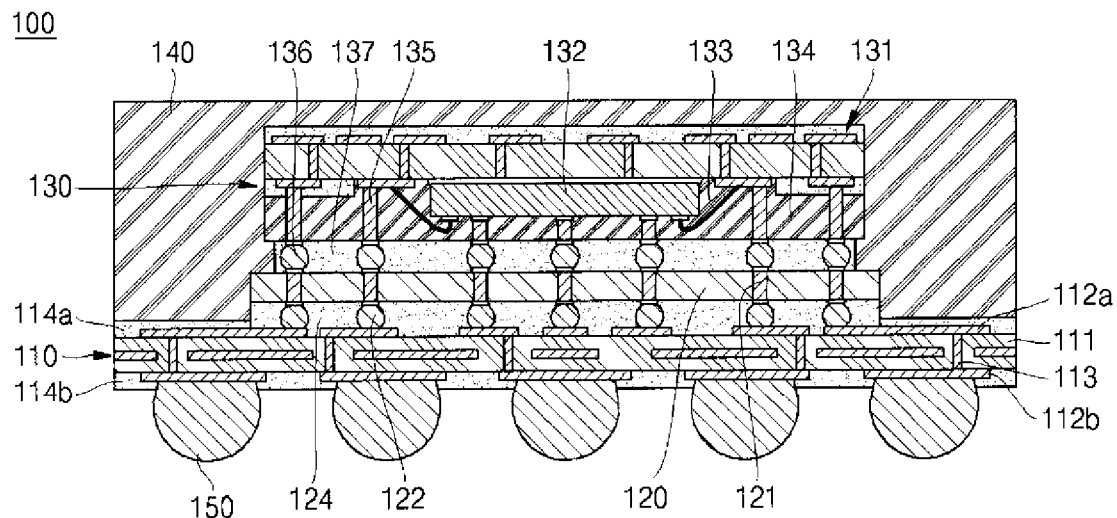

Referring now to FIG. 15E, in the next step S5 of the fabrication process for the semiconductor device 100, the solder balls 150 are electrically connected to prescribed portions of the conductive pattern 112b of the substrate 110. As seen in FIG. 15E, the solder mask 114b extends into contact with the solder balls 150. The solder balls 150 may be fabricated from the same materials described above.

Though not shown, the electrical connection of the solder balls 150 to the conductive pattern 112b may be followed by marking and sawing steps in relation to the semiconductor device 100. In the marking step, laser or ink is used to mark the product name, the trademark and the manufacturer of the semiconductor device 100 on a prescribed surface of the package body 140. Typically, a plurality of semiconductor devices 100 will be fabricated on a broad substrate in the form of a matrix comprising a plurality of interconnected substrates 110. In the sawing step, the individual semiconductor devices 100 are separated from the broad substrate.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device, comprising:
   a substrate having an electrically conductive pattern formed thereon;
   a first semiconductor die having a plurality of through-silicon vias formed therein and electrically connected to the conductive pattern of the substrate; and
   a semiconductor package having a plurality of through-mold vias formed therein and electrically connected to the through-silicon vias of the first semiconductor die.

2. The semiconductor device of claim 1 further comprising a plurality of solder balls electrically connected to the conductive pattern of the substrate.

3. The semiconductor device of claim 1 further comprising a second semiconductor die positioned between the first semiconductor die and the semiconductor package, the second semiconductor die having a plurality of through-silicon vias formed therein and electrically connected to the through-silicon vias of the first semiconductor die and the through-mold vias of the semiconductor package.

4. The semiconductor device of claim 3 further comprising a package body which covers at least portions of the substrate, the first semiconductor die, the second semiconductor die and the semiconductor package.

5. The semiconductor device of claim 4 further comprising a third semiconductor die electrically connected to the semiconductor package and exposed in the package body.

6. The semiconductor device of claim 1 further comprising a package body which covers at least portions of the substrate, the first semiconductor die and the semiconductor package.

7. A semiconductor device comprising:
   a substrate having an electrically conductive pattern formed thereon;

a first semiconductor die having a plurality of through-silicon vias formed therein and electrically connected to the conductive pattern of the substrate;

a second semiconductor die electrically connected to the through-silicon vias of the first semiconductor die, the first semiconductor die being disposed between the substrate and the second semiconductor die;

a semiconductor package attached to the second semiconductor die, the first and second semiconductor dies being disposed between the substrate and the semiconductor package;

at least one conductive wire electrically connecting the semiconductor package to the conductive pattern of the substrate; and a package body at least partially encapsulating the substrate, the first semiconductor die, the second semiconductor die, the semiconductor package and the conductive wire.

8. The semiconductor device of claim 7 further comprising a plurality of solder balls electrically connected to the conductive pattern of the substrate.

9. A semiconductor device, comprising:
   a substrate having an electrically conductive pattern formed thereon;
   a first semiconductor die electrically connected to the conductive pattern of the substrate;
   an inner package body at least partially covering the first semiconductor die and the substrate, the inner package body having a plurality of through-mold vias formed therein and electrically connected to both the conductive pattern of the substrate and the first semiconductor die;
   a second semiconductor die electrically connected to the through-mold vias of the inner package body; and
   a package body which encapsulates at least portions of the inner package body, the second semiconductor die and the substrate.

10. The semiconductor device of claim 9 wherein the first semiconductor die is electrically connected to the conductive pattern of the substrate through the use of at least one conductive wire which is covered by the inner package body.

11. The semiconductor of claim 9 wherein the first semiconductor die is electrically connected to the conductive pattern of the substrate through the use of conductive bumps which are covered by the inner package body.

12. The semiconductor device of claim 9 further comprising a third semiconductor die which is interposed between the inner package body and the second semiconductor die and is at least partially encapsulated by the package body, the third semiconductor die having a plurality of through-silicon vias formed therein which are electrically connected to the through-mold vias of the inner package body and to the first second semiconductor die.

13. A semiconductor device, comprising:
   a substrate having an electrically conductive pattern formed thereon;
   a first semiconductor die electrically connected to the conductive pattern of the substrate;
   a semiconductor package having a plurality of through-mold vias firmed therein and electrically connected to the first semiconductor die; and
   a package body which encapsulates at least portions of the substrate, the first semiconductor die, and the semiconductor package.

14. The semiconductor device of claim 13 wherein the semiconductor package includes an inner semiconductor die which is electrically connected to the first semiconductor die by the through-mold vias of the semiconductor package.

15. The semiconductor device of claim 13 wherein at least a portion of the semiconductor package is exposed within the package body.

16. The semiconductor device of claim 13 further comprising a second semiconductor die positioned between and electrically connected to the first semiconductor die and the through-mold vias of the semiconductor package, the second semiconductor die being at least partially encapsulated by the package body.

17. A semiconductor device, comprising:
   a substrate having an electrically conductive pattern formed thereon;
   a first semiconductor die electrically connected to the conductive pattern of the substrate;
   an inner package body at least partially covering the first semiconductor die and the substrate, the inner package body having a plurality of through-mold vias formed therein and electrically connected to both the conductive pattern of the substrate and the first semiconductor die;
   a second semiconductor die electrically connected to the through-mold vias of the inner package body; and
   a third semiconductor die interposed between the inner package body and the second semiconductor die, the third semiconductor die having a plurality of through-silicon vias formed therein which are electrically connected to the through-mold vias of the inner package body and to the second semiconductor die.

18. The semiconductor device of claim 17 further comprising a package body which covers at least portions of the first and second semiconductor dies, the inner package body, and the substrate.

* * * * *